INVENTOR
RICHARD J. WARING
BY Jeffers and Young
ATTORNEYS

INVENTOR
RICHARD J. WARING
BY Jeffers and Young
ATTORNEYS

United States Patent Office 3,541,472
Patented Nov. 17, 1970

3,541,472
BLOCKING OSCILLATOR

Richard J. Waring, Auburn, Ind., assignor to The Magnavox Company, Fort Wayne, Ind., a corporation of Delaware Filed Apr. 8, 1968, Ser. No. 719,468
Int. Cl. H03k 3/30
U.S. Cl. 331—112 5 Claims

ABSTRACT OF THE DISCLOSURE

A blocking oscillator has a transformer and a control transistor. An auxiliary transistor has its emitter-collector circuit connected in parallel with the primary coil of the transformer and has its base terminal unconnected. The auxiliary transistor is poled to become conductive when the control transistor turns off and the field in the transformer collapses.

This invention relates to blocking oscillators and is particularly concerned with a novel arrangement for dissipating the energy in a blocking oscillator transformer in an extremely short time and with circuit components of simple and inexpensive nature.

Blocking oscillators are, of course, well known and are used in connection with many electronic circuit arrangements. A particular place where a blocking oscillator is employed is in connection with the vertical deflection element in a television picture tube. With television picture tubes the cathode beam directed toward the screen sweeps horizontally due to a horizontal deflection element and the horizontally oscillating beam is caused to traverse the screen of the tube in the vertical direction by a vertical deflecting element. The deflecting elements are usually in the form of coils.

The current supply to the vertical deflecting element is in the form of a sawtooth wave having a steep side of shorter duration and a less steep side of longer duration. This wave form is obtained from circuitry, the input to which is the output of a blocking oscillator.

The blocking oscillator is triggered at intervals of 16.7 milliseconds and at the beginning of each 16.7 millisecond period, there is a period of about 1,000 microseconds during which the picture tube is blanked out. This period corresponds to the steep side of the sawtooth wave. At the end of the 1,000 microsecond retrace period the cathode beam again commences scanning the screen at the top thereof and progresses gradually toward the bottom of the screen which it reaches at the end of the 16.7 millisecond period. This period corresponds to the less steep side of the sawtooth wave.

In blocking oscillator arrangements employed for the purpose of developing the sawtooth wave referred to, some difficulty has always been experienced in dissipating the energy in the oscillator transformer so as to avoid any irregularity in the less steep side of the sawtooth wave developed thereby. Diodes have been employed connected in parallel with the coils of the oscillator transformer and while these elements dissipate the energy stored in the oscillator transformer, it has been found that the final dissipation of energy does not occur until about half way through a period of scanning the screen of the picture tube and, at this point, a slight irregularity or discontinuity will appear in the pattern of the sawtooth wave which tends to produce a horizontal white line about half-way down the screen of the picture tube.

This problem has been dealt with in various manners, but has never been completely eliminated and all previous procedures for dealing with this problem have been relatively expensive.

The present invention is based primarily on the concept that the energy in the blocking oscillator transformer is dissipated within the vertical blanking period so that throughout the time that the cathode beam is scanning the screen of the picture tube, there will be no irregularity or discontinuity in the sawtooth pattern of the voltage supplied to the vertical deflecting element and, thus, there will be no raster problem in the form of a horizontal white line in the picture displayed on the picture tube.

With the foregoing general comments in mind, a primary objective of the present invention is the provision of an arrangement for quickly dissipating the energy stored in the transformer of a blocking oscillator at the end of the conduction period of the oscillator.

Another object of the present invention is the provision of an arrangement wherein the sawtooth wave form supplied to the vertical deflection element of the picture tube is maintained smooth and without irregularities or discontinuities during the effective period thereof.

A still further object of the present invention is the provision of an energy dissipating arrangement, particularly adapted for use with the transformer of a blocking oscillator which is extremely simple and inexpensive and which has operating characteristics superior to those of arrangements heretofore known.

The foregoing objects, as well as other objects and advantages, of the present invention will become more readily apparent upon reference to the following detailed specification taken in connection with the accompanying drawings, in which.

Figure 1:
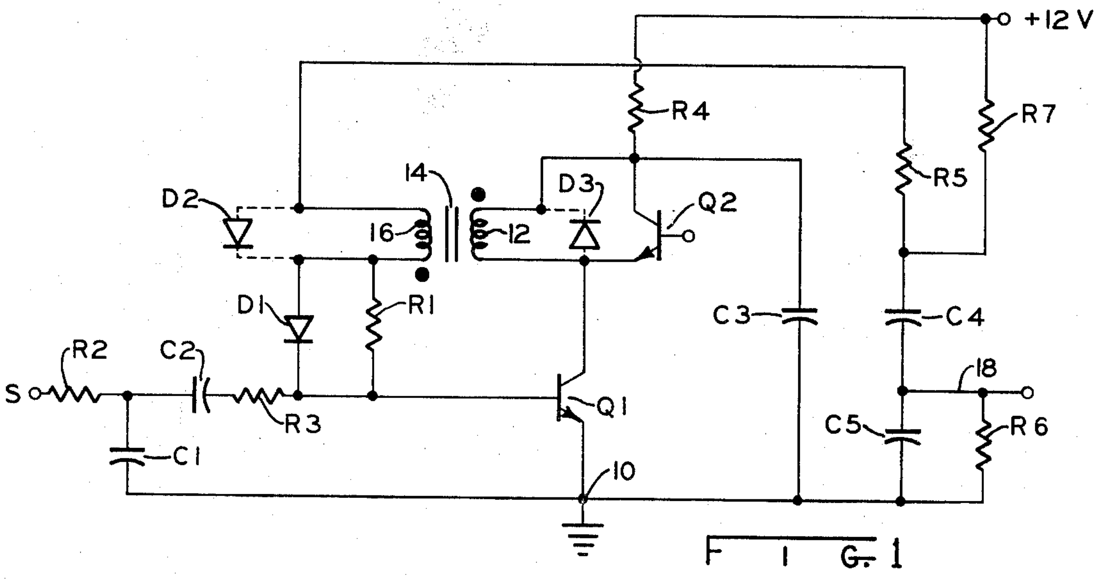
FIG. 1 shows a portion of the circuitry of a television receiver and, in particular, shows the blocking oscillator which initiates development of the sawtooth wave for the vertical deflecting element of a picture tube.

Referring to the drawings somewhat more in detail, FIG. 1 shows a blocking oscillator in the form of an NPN transistor Q1, having its emitter connected to a ground at 10, and having its collector connected to one end of the primary coil 12 of a transformer 14. The base of the transistor Q1 is connected through a resistor R1 to one end of the secondary coil 16 of the transformer 14. A diode D1 is connected in bypassing relation to the resistor R1 and is poled toward the base of the transistor Q1. The transistor Q1 is normally oscillating and is adapted for receiving synchronizing pulses from a source S. The source S is connected through a resistor R2 and a capacitor C1 to ground, with a connection being taken off between the resistor R2 and the capacitor C1 and leading through a capacitor C2 and a resistor R3 to the base of transistor Q1.

The other end of primary coil 12 is connected through a capacitor C3 to ground and through a resistor R4 to a plus12 volts voltage supply.

The other end of the secondary coil 16 is connected through a resistor R5 and two capacitors C4, C5 to ground. The junction of the resistor R5 and the capacitor C4 is connected to the plus 12 volts through a resistor R7. A wire 18 is connected to the junction of the capacitors C4, C5 for connection to other electronic circuits. These circuits may take the form of driver and output transistors to the vertical deflecting element in the picture tube. The driver and output transistors and associated circuit components provide for the supply of a sawtooth wave to the vertical deflecting element of the picture tube. A resistor R6 is connected between the wire 18 and ground.

In FIG. 1, the transistor Q1 is normally oscillating and the oscillator is in a free running state. At intervals of 16.7 milliseconds, however, a positive going pulse will be supplied from the source S which will trigger the transistor Q1 into synchronization. When the transistor Q1 goes into conduction, its collector goes toward ground potential and current will flow from the plus 12 volts source through the resistor R4 and the primary coil 12. When the transistor Q1 is driven to saturation and current flow through primary coil 12 ceases, the transistor then goes to nonconduction. During the conduction period of the transistor Q1, a positive going pulse on the base of the transistor Q1 is supplied through the resistor R5 so as to charge the capacitor C4. This will develop biasing potential on the wire 18 that will provide, via following circuitry, the wave form referred to for the vertical deflecting element of the picture tube.

The present invention is particularly concerned with the dissipation of energy from the transformer 14 at the end of the conduction period of the oscillator transistor Q1. Heretofore, diodes, such as those indicated in dotted lines at D2 and D3 have been provided, connected in parallel with the primary coil 12 and the secondary coil 16 of the transformer 14 so that at the end of the conduction period of the oscillator transistor, the magnetic energy stored within the transformer will be dissipated through the diodes D2 and D3. The diodes D2 and D3 are poled so that during the conduction period of the transistor Q1, the diodes are substantially nonconductive and have no influence on the operation of the oscillator. While the diodes D2 and D3 will dissipate the energy from the oscillator transformer, it requires a substantial period of time to complete the dissipation of energy because they commence to conduct as soon as the voltages in the coils 12 and 16 reverse. The slow rate of dissipation of energy continues for a long enough time to introduce an irregularity in the sawtooth wave form supplied to the vertical deflecting element at about the point marked X in FIG. 2. As has been mentioned, this tends to produce a horizontal white line about the middle of the television picture.

According to the present invention a novel arrangement is provided for dissipating this energy in the form of a second transistor Q2. The transistor Q2 is an NPN transistor having its emitter connected to the end of the primary coil 12 which is connected to the collector of transistor Q1, and having its collector connected to the opposite end of the primary coil 12. The base of the transistor Q2 is not connected, so that its base terminal may be clipped off.

In operation, the transistor Q2 works somewhat in the manner of a diode and a Zener diode connected in series and poled in respectively opposite directions.

In operation, when the transistor Q1 is conducting and its collector is substantially at ground potential, the collector to base junction of the transistor Q2 is reversed biased and the transistor Q2 is nonconductive and has absolutely no effect on the oscillator circuit. However, when the transistor Q1 goes to nonconduction, the stored magnetic energy in the transformer 14 will develop a voltage pulse in the primary coil 12 which will be positive at the end of the coil 12 connected to the collector of the transistor Q1. This voltage will rise extremely rapidly until it reaches a value such that the base-emitter junction of the transistor Q2 will break down. At this time, the collector to base junction of the transistor Q2 is forward biased so that the transistor Q2 can conduct. Thus, the voltage is clipped at this level and the energy in the transformer 14 is quickly dissipated.

As opposed to a conventional diode, as shown by the diode D3 in FIG. 1, the transistor Q2 does not commence to conduct as soon as the voltage across the primary coil 12 reverses, but remains nonconductive until the voltage rises to a substantial level. The voltage rise in the primary coil 12 is substantially instantaneous when the transistor Q1 goes to nonconduction and, at this increased voltage, when the transistor Q2 does go to conduction, the energy in the transformer 14 is dissipated extremely quickly.

Figure 2:
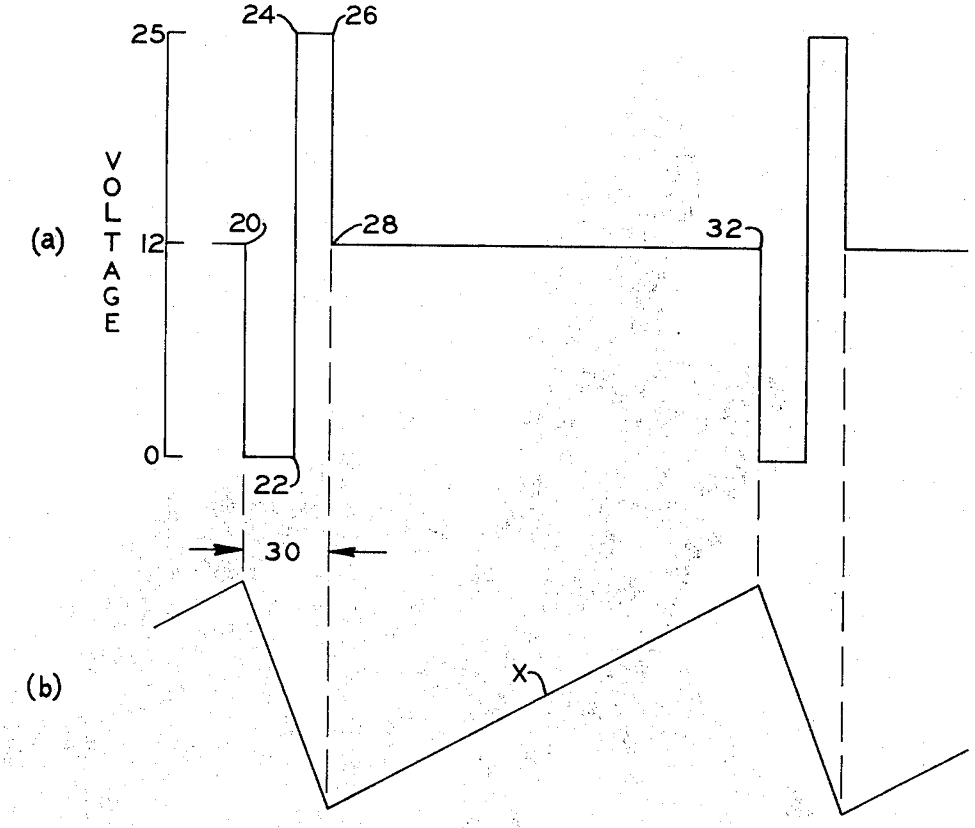
FIG. 2(*a*) illustrates voltage conditions pertaining to the collector-emitter circuit of the blocking oscillator transistor of FIG. 1, and FIG. 2(*b*) shows in connection therewith the sawtooth wave form which is finally supplied to the vertical deflecting element of the picture tube.

FIG. 2(*a*) shows the voltage conditions which exist between the collector and emitter of the transistor Q1. In FIG. 2(*a*), at the point 20, the transistor Q1 goes to conduction and the voltage between the collector and emitter of the transistor Q1 goes to zero. At the point 22, the transistor Q1 ceases to conduct and the voltage between its collector and emitter commences to rise. This voltage rises substantially instantaneously to the point 24 and at this point 24, the transistor Q2 will break down and commence to conduct. At the point 26, the energy in the transformer 14 is fully dissipated and the voltage between the collector and emitter of the transistor Q1 has gone to zero as exemplified by the point 28. It will be noted that this entire cycle, including the dissipation of energy from the transformer 14, takes place within the vertical retrace period indicated by the dimension 30. The time interval from the point 20 to the point 22 is on the order of about 500 microseconds and the interval from the point 24 to the point 26 is on the order of about 300 microseconds.

It will be appreciated that from the point 28 to the point 32 there is no disturbance whatsoever which can influence the sawtooth wave which is shown in FIG. 2(*b*) and which is the form of the current wave supplied to the vertical deflecting element of the picture tube. Furthermore, the transistor Q1 is protected from high voltage pulses.

Figure 3:
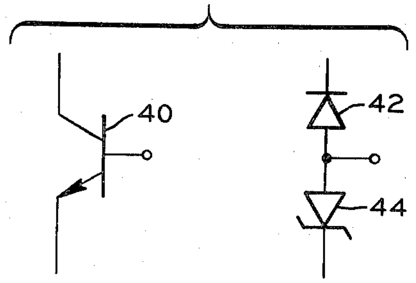
FIG. 3 is a schematic view showing an NPN transistor and a substantially equivalent circuit therefor when the transistor is used according to the present invention.

Turning now to FIG. 3, there is shown an NPN transistor 40 of the nature which has been described in connection with the transistor Q2 of FIG. 1. A substantially equivalent circuit is shown at the right of FIG. 3, consisting of a diode 42 and a Zener diode 44 poled in respectively opposite directions. The transistor 40 is obviously simpler and more inexpensive than the combination of the diode 42 and Zener diode 44.

Figure 4:
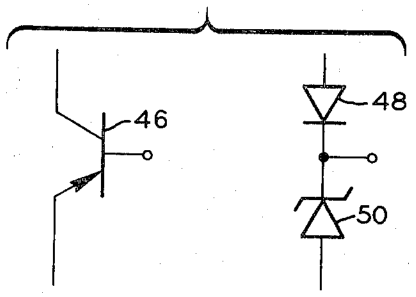
FIG. 4 is a view like FIG. 3 showing a PNP transistor and a substantially equivalent circuit therefor.

FIG. 4 shows a PNP transistor 46 and its equivalent circuit consisting of a diode 48 and a Zener diode 50.

Figure 5:
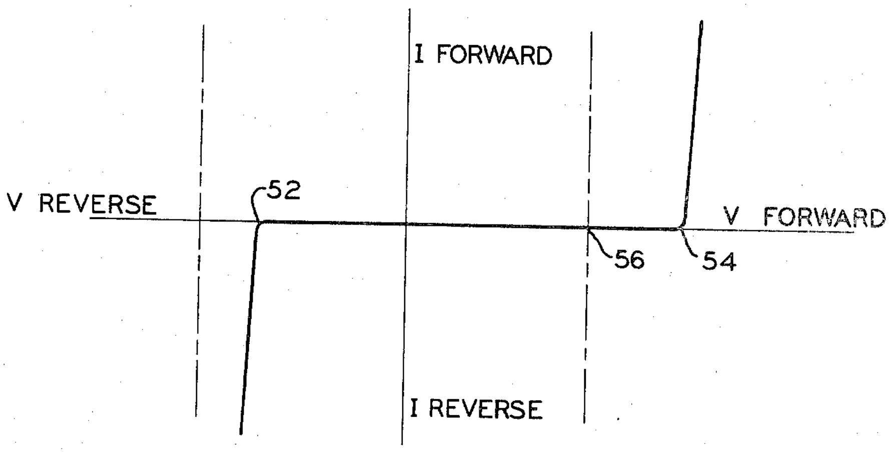
FIG. 5 is a view showing the manner in which the present invention operates to provide for rapid dissipation of the blocking oscillator transformer energy.

FIG. 5 shows the current-voltage conditions in the transistor Q2 of FIG. 1. The transistor Q1 is substantially nonconductive from the point 52 on the reverse side to the point 54 on the forward side and thereafter breaks down for substantially avalanche conduction. The voltage during the period that the transistor Q1 is conducting does not rise above point 56 so that the transistor Q2 does not affect the oscillator circuit. On the other side, when the transistor Q1 is not conducting, the voltage very quickly rises beyond the point 52 so that an avalanche breakdown of the transistor Q2 occurs, thereby providing for the extremely rapid dissipation of energy referred to.

From the foregoing description, it will be seen that the present invention provides for a novel manner of extremely quickly dissipating the energy in the transformer of a blocking oscillator and that the invention is particularly well adapted for use in television circuitry because of the importance of such extremely rapid dissipation of the energy of the blocking oscillator pertaining to the vertical deflecting element of the picture tube. It will be evident, however, that the present invention is applicable in other situations than the particular one in which it is illustrated. The choice of an energy dissipating transistor to be used will depend on the polarities of the circuit and the voltage levels encountered. The particular circuit illustrated represents a preferred arrangement according to the present invention, but it will be understood that other arrangements are possible.

It will be understood that this invention is susceptible to modification in order to adapt it to different usages and conditions and, accordingly, it is desired to comprehend such modifications within this invention as may fall within the scope of the appeneded claims.

What is claimed is:

1. In an electronic circuit; a coil through which pulses of effective current flow in one direction and in which a voltage is induced by the collapsing of the magnetic field established by each said effective current pulse when each current pulse ceases and wherein the energizing of the magnetic field is to be dissipated quickly at the end of each current pulse, and a transistor having its collector connected to the coil near one end of the coil and its emitter connected to the coil near the other end of the coil and the base of the transistor being unconnected, said transistor being nonconductive while a current pulse flows in said coil, the polarity of the voltage induced in the coil by the collapsing field being such as to tend to cause current to flow through the transistor in a direction opposite to that in which current would flow under normal conditions whereby the transistor is nonconductive below a predetermined said induced voltage and becomes freely conductive above said predetermined voltage.

2. An electronic circuit according to claim 1 in which said coil is the primary coil of the transformer of a blocking oscillator.

3. An electronic circuit according to claim 2 in which said primary coil is serially connected with the collector-emitter circuit of a second transistor between a source of voltage and ground.

4. An electronic circuit according to claim 3 in which a sync circuit is connected to the base of said second transistor to supply sync pulses thereto to synchronize oscillations of said oscillator, said transformer comprising a secondary coil having one end connected to said sync circuit for feedback thereto and its other end connected to a load circuit which the oscillator supplies.

5. An electronic circuit according to claim 4 in which said load circuit is the circuit which supplies the vertical deflecting means of a television picture tube and the output from said oscillator is operable to develop a sawtooth waveform for said vertical deflecting means, said waveform comprising a change in one direction during a first and shorter period during conduction of said second transistor and a change in the other direction during a second and longer period following conduction of said transistor, said first mentioned transistor effecting dissipation of the energy stored in the field of said transformer within the limits of said first period.

References Cited

UNITED STATES PATENTS 3,199,045 8/1965 Herick et al. ---------- 331—8

FOREIGN PATENTS 851,325 10/1960 Great Britain.

OTHER REFERENCES

Chen et al., Electronic Design, "Astable Blocking Oscillators," pp. 22–25, Mar. 1, 1965, 331-112.

JOHN KOMINSKI, Primary Examiner

U.S. Cl. X.R.

307—318; 315—27; 331—149